(12) United States Patent
Choi et al.

(10) Patent No.: US 12,433,095 B2
(45) Date of Patent: Sep. 30, 2025

(54) DISPLAY DEVICE

(71) Applicants: Samsung Display Co., Ltd., Yongin-si (KR); Industry-Academic Cooperation Foundation, Yonsei University, Seoul (KR)

(72) Inventors: Jin Hwan Choi, Seoul (KR); Taewoong Kim, Seongnam-si (KR); Jong-Hyun Ahn, Seoul (KR); Heechang Shin, Seoul (KR); Minwoo Choi, Seoul (KR); Luhing Hu, Seoul (KR)

(73) Assignees: SAMSUNG DISPLAY CO., LTD., Gyeonggi-Do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 202 days.

(21) Appl. No.: 18/036,503

(22) PCT Filed: Jan. 18, 2021

(86) PCT No.: PCT/KR2021/000657
§ 371 (c)(1),
(2) Date: May 11, 2023

(87) PCT Pub. No.: WO2022/102872
PCT Pub. Date: May 19, 2022

(65) Prior Publication Data
US 2024/0015904 A1 Jan. 11, 2024

(30) Foreign Application Priority Data
Nov. 12, 2020 (KR) .................. 10-2020-0151186

(51) Int. Cl.
*H05K 5/02* (2006.01)
*H10K 59/00* (2023.01)
(Continued)

(52) U.S. Cl.
CPC ............... *H10K 59/00* (2023.02); *H05K 5/02* (2013.01); *H10K 59/87* (2023.02); *H10K 59/80* (2023.02); *H10K 2102/311* (2023.02)

(58) Field of Classification Search
None
See application file for complete search history.

(56) References Cited

U.S. PATENT DOCUMENTS 9,756,702 B2   9/2017 Hamel
10,198,041 B2  2/2019 Myeong et al.
(Continued)

FOREIGN PATENT DOCUMENTS

CN   111477106 A    7/2020
KR   1020150112715 A   10/2015
(Continued)

OTHER PUBLICATIONS

KR1020200052621 Machine Translation via WIPO (Year: 2020).*
(Continued)

*Primary Examiner* — Laura C Powers
(74) *Attorney, Agent, or Firm* — CANTOR COLBURN LLP

(57) ABSTRACT

This display device may comprise: a display panel; a stress control layer which is disposed on the rear surface of the display panel and includes an auxetic structure having a negative Poisson's ratio; and a support layer which is disposed under the stress control layer and supports the display panel.

19 Claims, 18 Drawing Sheets

(51) Int. Cl.
  *H10K 59/80* (2023.01)
  *H10K 102/00* (2023.01)

(56) References Cited

U.S. PATENT DOCUMENTS

| | | |
|---|---|---|
| 10,217,950 B2 | 2/2019 | Joo et al. |
| 10,503,307 B2 | 12/2019 | Hong et al. |
| 11,309,501 B2 | 4/2022 | Lee et al. |
| 11,822,388 B2 | 11/2023 | Cai et al. |

FOREIGN PATENT DOCUMENTS

| | | |
|---|---|---|
| KR | 20160042288 A | 4/2016 |
| KR | 1020170052805 A | 5/2017 |
| KR | 20180061003 A | 6/2018 |
| KR | 101894030 B1 | 8/2018 |
| KR | 20200052621 A | 5/2020 |
| KR | 20200082370 A | 7/2020 |
| KR | 2020162864 A1 | 8/2020 |
| KR | 20200103217 A | 9/2020 |
| KR | 1020200104966 A | 9/2020 |
| WO | 2020162864 A1 | 8/2020 |

OTHER PUBLICATIONS

KR1020200082370 Machine Translation via WIPO (Year: 2020).*
International Search Report for PCT/KR2021/000657 dated Aug. 5, 2021; 3 pages.

* cited by examiner

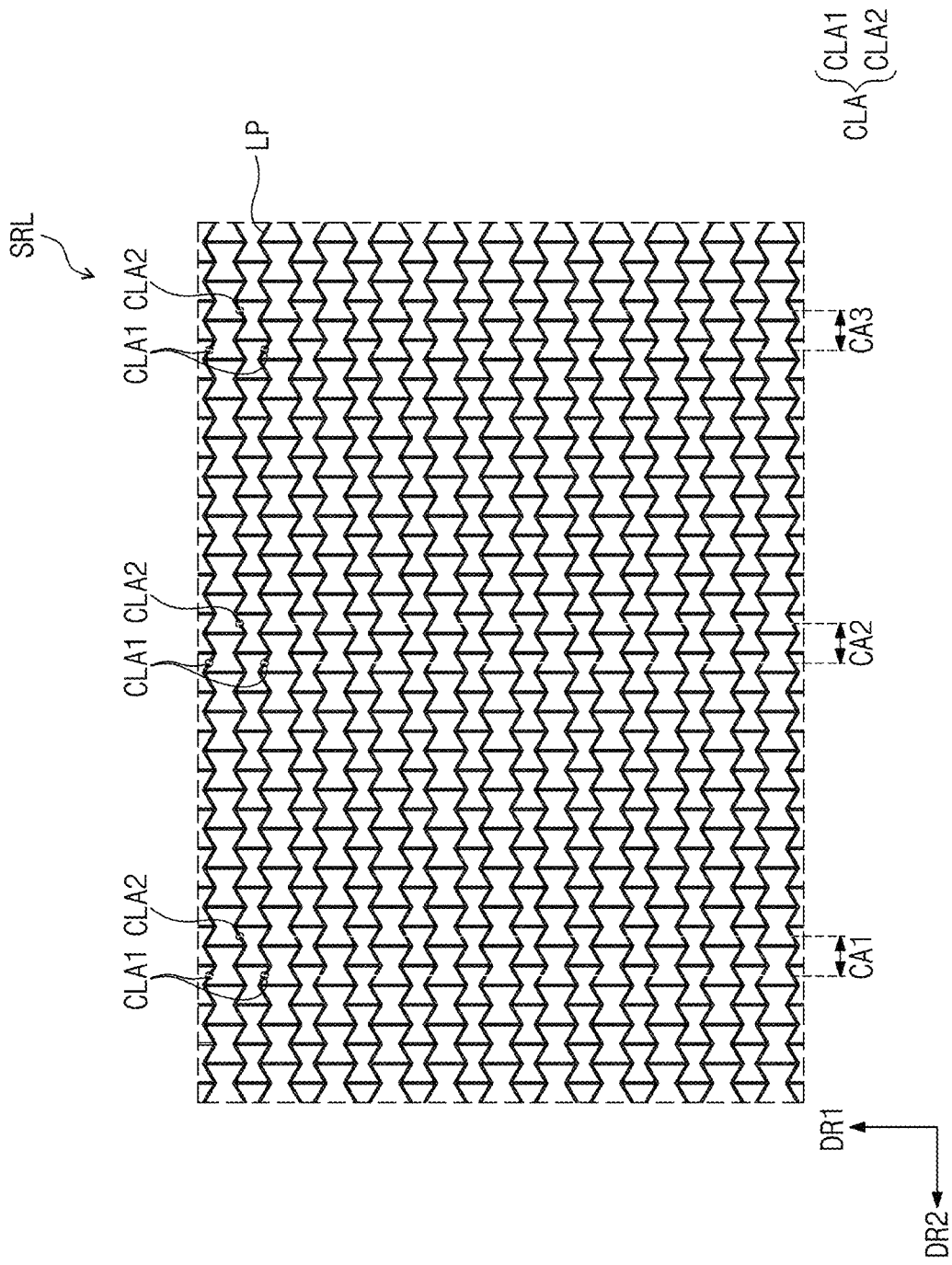

DISPLAY DEVICE

TECHNICAL FIELD

The present invention relates to a display device, and more particularly, to a flexible display device.

BACKGROUND ART

Electronic equipment such as smart phones, tablets, notebook computers, car navigation systems, and smart televisions are being developed. Each of the electronic equipment may include a display device for providing information.

Various types of display devices are being developed to satisfy the user's UX/UI. Among them, the development of flexible display devices has been activated.

DISCLOSURE OF THE INVENTION

Technical Problem

An aspect of the present invention is to provide a flexible display device having a reduced defect rate.

Technical Solution

A display device according to an embodiment of the present invention includes a display panel, a stress control layer disposed on a rear surface of the display panel and including an auxetic structure having a negative Poisson's ratio, and a support layer disposed under the stress control layer to support the display panel.

According to an embodiment of the present invention, the display panel may provide a display surface defined by a first direction and a second direction crossing the first direction, and in a first mode of the display device, the display surface may provide a flat surface, and in a second mode of the display device, at least a portion of the display surface provides a curved surface with respect to a reference axis.

According to an embodiment of the present invention, the support layer may include a plurality of support sticks, each parallel to the reference axis, and in the first mode, the plurality of support sticks may be arranged in a direction orthogonal to the reference axis.

According to an embodiment of the present invention, the support layer may further include an elastomer layer. At least a portion of the elastomer layer may be disposed between the stress control layer and the plurality of support sticks.

According to an embodiment of the present invention, the plurality of support sticks may be embedded in the elastomer layer.

According to an embodiment of the present invention, the auxetic structure may include a line pattern defining a plurality of unit cells. A plurality of disconnection points may be defined in the line pattern.

According to an embodiment of the present invention, within a direction orthogonal to the reference axis, a partial area of the auxetic structure may be defined as a disconnection area disposed between a first imaginary line and a second imaginary line. Each of the first imaginary line and the second imaginary line may be parallel to the reference axis. In a direction orthogonal to the reference axis, disconnection points, which are disposed at a one side, of the plurality of disconnection points may be disposed on the first imaginary line, and disconnection points, which are disposed at an opposite side, of the plurality of disconnection points may be disposed on the second imaginary line. In the direction orthogonal to the reference axis, a width of the disconnection area may be 1% to 10% of a width of the auxetic structure.

According to an embodiment of the present invention, the line pattern may include first components and second components, the second components may extend in a direction different from a direction that the first components are extended. The plurality of disconnection points may be defined in components, of which an extension direction is more approximate to a direction that is orthogonal to the reference axis, among the first components and the second components.

According to an embodiment of the present invention, the auxetic structure may include a plurality of portions spaced apart from each other in a direction orthogonal to the reference axis. Each of the plurality of disconnection points may be defined on a corresponding imaginary line of the plurality of imaginary lines. Two adjacent portions of the plurality of portions may be divided by a corresponding imaginary line of the plurality of imaginary lines.

According to an embodiment of the present invention, the line pattern may have a thickness of 5 micrometers (μm) to 150 μm.

According to an embodiment of the present invention, the line pattern may include stainless steel, copper, aluminum, or high-density polyethylene ("HDPE").

According to an embodiment of the present invention, the stress control layer may further include an adhesive layer configured to couple the rear surface of the display panel to the auxetic structure.

According to an embodiment of the present invention, the auxetic structure may be embedded in the adhesive layer.

According to an embodiment of the present invention, the stress control layer may further include an elastomer layer. The auxetic structure may be embedded in the elastomer layer.

According to an embodiment of the present invention, the display device may be foldable or rollable.

A display device according to an embodiment of the present invention includes a display panel, a stress control layer disposed on a rear surface of the display panel and including a line pattern configured to define a plurality of openings, and a support layer disposed under the stress control layer to support the display panel. The line pattern includes first components and second components, and the second components extend in a direction different from a direction in which the first components are extended.

According to an embodiment of the present invention, the line pattern may include an auxetic structure having a negative Poisson's ratio.

According to an embodiment of the present invention, the display panel may provide a display surface. In a first mode of the display device, the display surface may provide a flat surface, and in a second mode of the display device, at least a portion of the display surface may provide a curved surface with respect to a reference axis.

According to an embodiment of the present invention, a plurality of disconnection points may be defined in the line pattern. Each of areas in which the plurality of disconnection points are disposed may be defined as a disconnection area, and in a direction orthogonal to the reference axis, the disconnection areas may have a width of 1 millimeter (mm) to 100 mm.

According to an embodiment of the present invention, a plurality of disconnection points may be defined in the line pattern.

According to an embodiment of the present invention, the plurality of disconnection points may be defined in components, of which an extension direction is more approximate to a direction that is orthogonal to the reference axis, among the first components and the second components.

Advantageous Effects

As described above, the stress control layer may reduce the stress due to the mechanical deformation such as the repeated rolling or folding of the display device. That is, the deformation of the display panel may be effectively prevented.

Particularly, in the display device including the plurality of support sticks that support the display panel, the stress control layer may effectively prevent the bending occurring by the plurality of support sticks from being transferred to the display panel.

BRIEF DESCRIPTION OF THE DRAWINGS

FIG. 8A is a plan view illustrating a stress control layer according to an embodiment of the present invention.

MODE FOR CARRYING OUT THE INVENTION

Figure 1A:
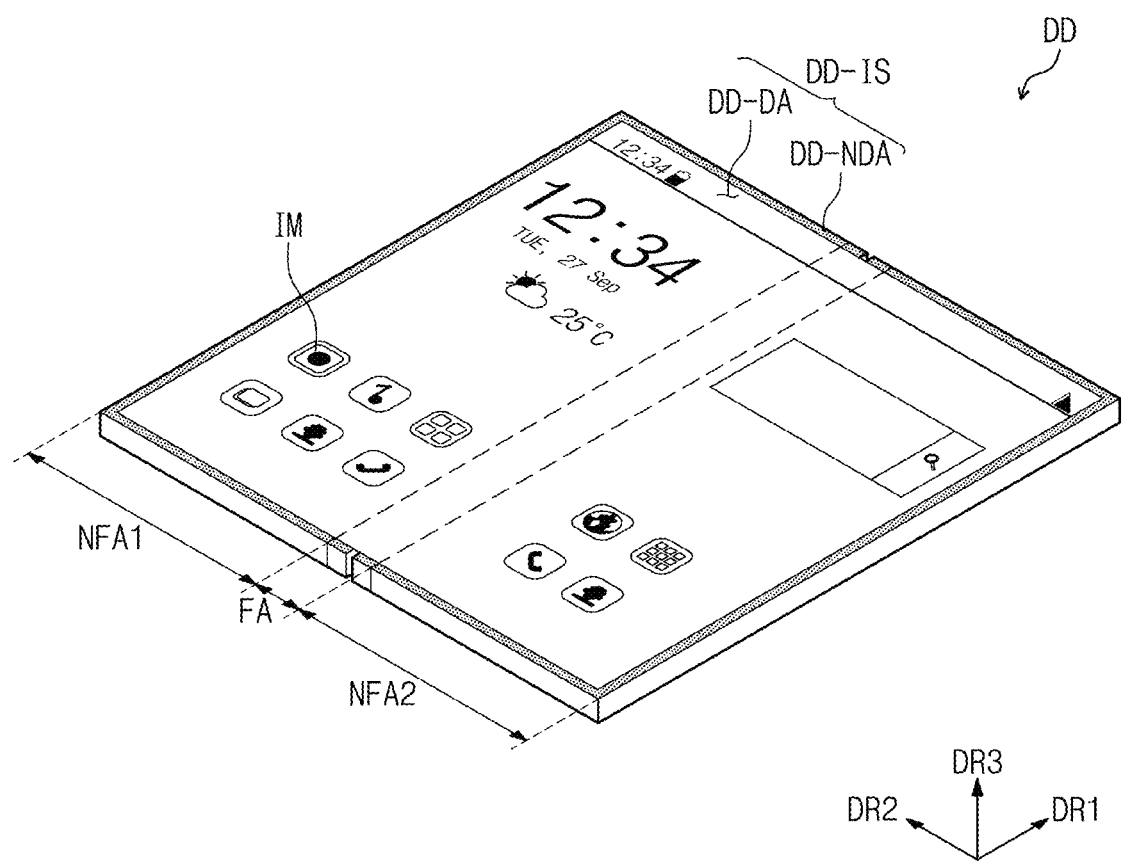
FIGS. 1A and 1B are perspective views of a display device according to an embodiment of the present invention.

In this specification, it will also be understood that when one component (or region, layer, portion) is referred to as being "on", "connected to", or "coupled to" another component, it can be directly disposed/connected/coupled on/to the other component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated elements.

It will be understood that although the terms such as 'first' and 'second' are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

Also, ""under", "below", "above", "upper", and the like are used for explaining relation association of the elements illustrated in the drawings. The terms may be a relative concept and described based on directions expressed in the drawings.

The meaning of 'include' or 'comprise' specifies a property, a fixed number, a process, an operation, an element, a component or a combination thereof, but does not exclude other properties, fixed numbers, processes, operations, elements, components or combinations thereof.

Unless otherwise defined, all terms (including technical and scientific terms) used herein have the same meaning as commonly understood by a person of ordinary skill in the art to which the present invention belongs. In addition, terms such as terms defined in commonly used dictionaries should be interpreted as having a meaning consistent with the meaning in the context of the related technology, and unless explicitly defined here, they are not interpreted as too ideal or too formal sense.

Hereinafter, embodiments of the present invention will be described with reference to the accompanying drawings.

Figure 1B:
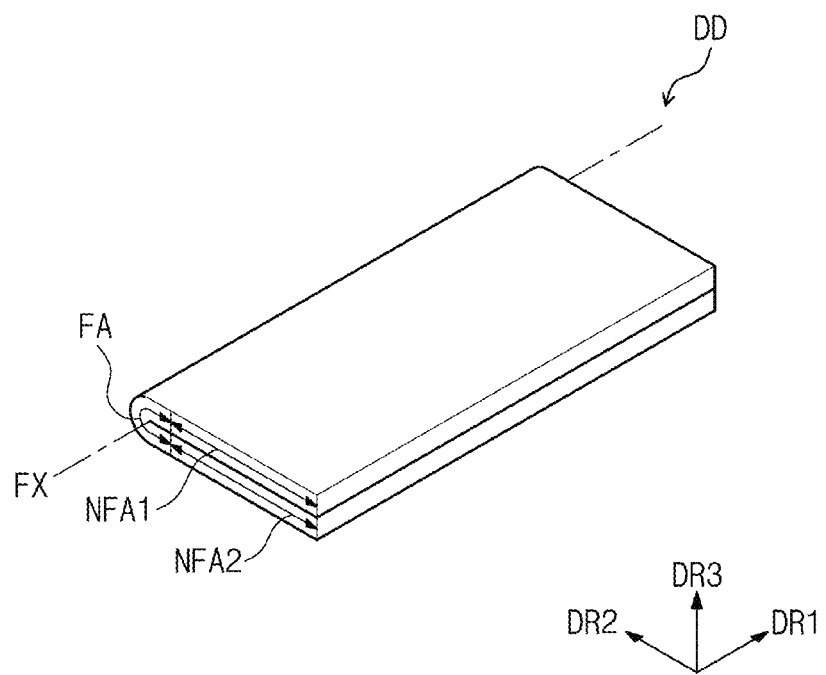
Figure 2A:
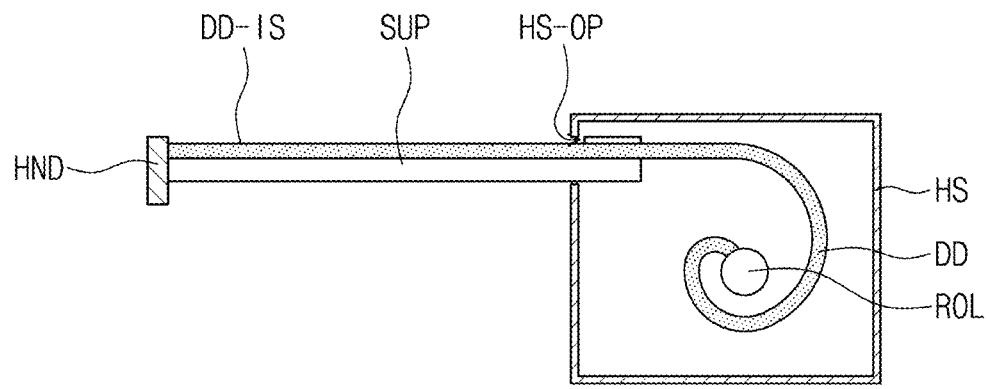
FIGS. 2A and 2B are perspective views of the display device according to an embodiment of the present invention.
Figure 2B:
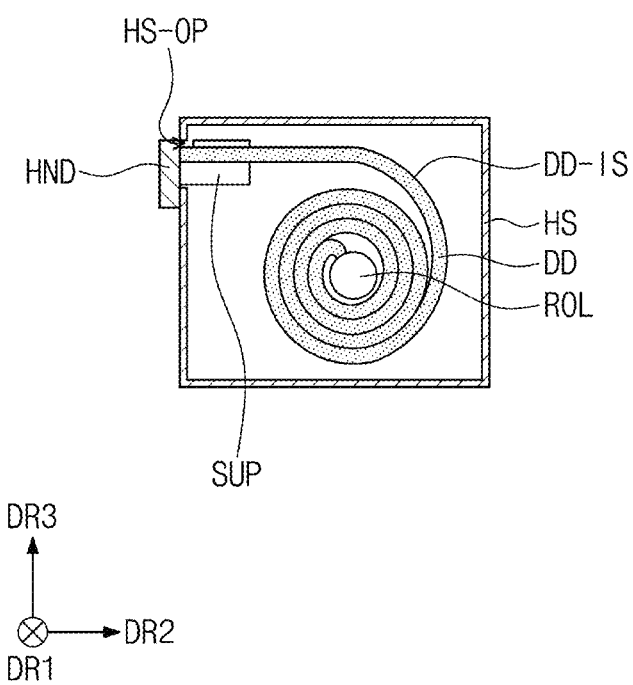

FIGS. 1A and 1B are perspective views of a display device DD according to an embodiment of the present invention. FIGS. 2A and 2B are perspective views of the display device according to an embodiment of the present invention.

FIGS. 1A and 1B illustrate a foldable display device DD as an example of a flexible display device, and FIGS. 2A and 2B illustrate a rollable display device DD as an example of the flexible display device. However, the present invention is not limited thereto and may be applied to another display device such as a slidable display device.

FIG. 1A illustrates an unfolded state (first mode) of the foldable display device DD. The display surface DD-IS is parallel to a surface defined by a first directional axis DR1 and a second directional axis DR2. A normal direction of the display surface DD-IS, i.e., a thickness direction of the display device DD is indicated as a third directional axis DR3. A front surface (or top surface) and a rear surface (or bottom surface) of each of members is distinguished based on the third directional axis DR3. Hereinafter, the first to third directions may be directions indicated by the first to third directional axes DR1, DR2, and DR3 and designated by the same reference numerals, respectively.

As illustrated in FIG. 1A, the display surface DD-IS includes a display area DD-DA on which an image IM is displayed and a non-display area DD-NDA that is adjacent to the display area DD-DA. The non-display area DD-NDA may be an area on which an image is not displayed. FIG. 1A illustrates icon images as an example of the image IM. For example, the display area DD-DA may have a rectangular shape. The non-display area DD-NDA may surround the display area DD-DA. However, an embodiment of the present invention is not limited thereto, and the display area DD-DA and the non-display area DD-NDA may be modified in shape.

FIG. 1B illustrates a folded state (second mode) of the foldable display device DD. As illustrated in FIG. 1B, the display device DD may include a plurality of areas defined according to the forms of operations. The display device DD may include a folding area FA that is folded on the basis of a folding axis FX, a first planar area NFA1 adjacent to the folding area FA, and a second planar area NFA2. In this embodiment, the folding axis FX may be parallel to the first direction axis DR1. The folding area FA is an area that substantially forms a curvature. The folding area FA provides the curved display surface DD-IS in the second mode. The folding axis FX may be a "reference axis" of the folding area FA.

In this embodiment, the display device DD in which the folding axis FX parallel to a long axis of the display device DD is defined is illustrated as an example. However, the present invention is not limited thereto, and the folding axis FX may be parallel to a short axis of the display device DD.

As illustrated in FIGS. 1A and 1B, the display device DD may be inner-folded or inner-bent so that the display surface DD-IS of the first planar area NFA1 and the display surface DD-IS of the second planar area NFA2 face each other. The display device DD according to an embodiment of the present invention may be outer-folded or outer-bent so that the display surface DD-IS is exposed to the outside.

In an embodiment of the present invention, the display device DD may include a plurality of folding areas FA. In addition, each of the folding areas FA may be defined to corresponding to a user's operation for manipulating the display device DD. For example, the folding area may be defined in a diagonal direction crossing the first direction axis DR1 and the second direction axis DR2 on a plane. The folding area FA may have a variable surface area and be determined according to a radius of curvature.

In an embodiment of the present invention, the display device DD may be configured so that an inner folding operation or outer folding operation from the unfolding operation are repeated, but the present invention is not limited thereto. In an embodiment of the present invention, the display device DD may be configured to select any one of the unfolding operation, the inner folding operation, and the outer folding operation.

Referring to FIGS. 2A and 2B, the rollable display device DD is accommodated in the housing HS. The rollable display device DD is accessible through an opening HS-OP. One end of the rollable display device DD is connected to a handle HND. The rollable display device DD is guided by the support SUP. The support SUP may include an assembly of support frames that are drawn out step by step during the unfolding operation. A roller ROL has a shape extending in the first direction DR1 and corresponds to a rolling axis RX. The rolling axis RX may be a reference axis of the rollable display device DD.

FIG. 2A illustrates an unfolded state (first mode) of the rollable display device DD. FIG. 2B illustrates a rolled state (second mode) of the rollable display device DD. When the display device DD is fully unfolded in the first mode, a portion of the display device DD exposed from at least the housing HS may provide a planar display surface DD-IS. A portion of the display device DD rolled in the first mode and the entire display device DD rolled in the second mode substantially form a curvature. The entire rolled display device DD provides a curved display surface DD-IS.

According to the present invention, a stress control layer, which will be described later, is disposed to overlap an area providing the curved display surface in the second mode of at least the display device DD. Thus, the stress control layer may be disposed in the folding area FA of at least the foldable display device DD. The stress control layer may be disposed over the entire area of the rollable display device DD. Since the stress control layer is disposed in the area providing the curved display surface, the stress control layer may reduce stress due to mechanical deformation such as repetitive rolling or folding of the display device. Hereinafter, the stress control layer will be described in more detail.

Figure 3:
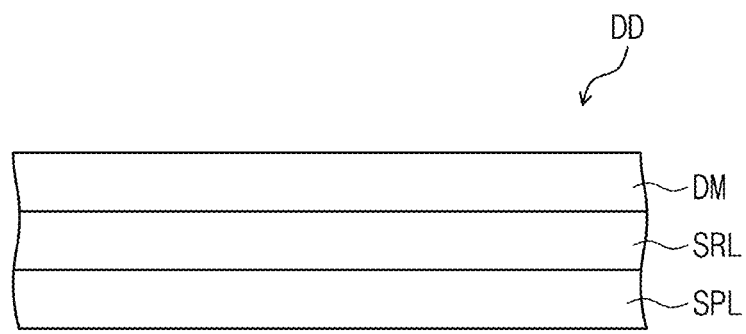
FIG. 3 is a cross-sectional view of the display device according to an embodiment of the present invention.
Figure 4A:
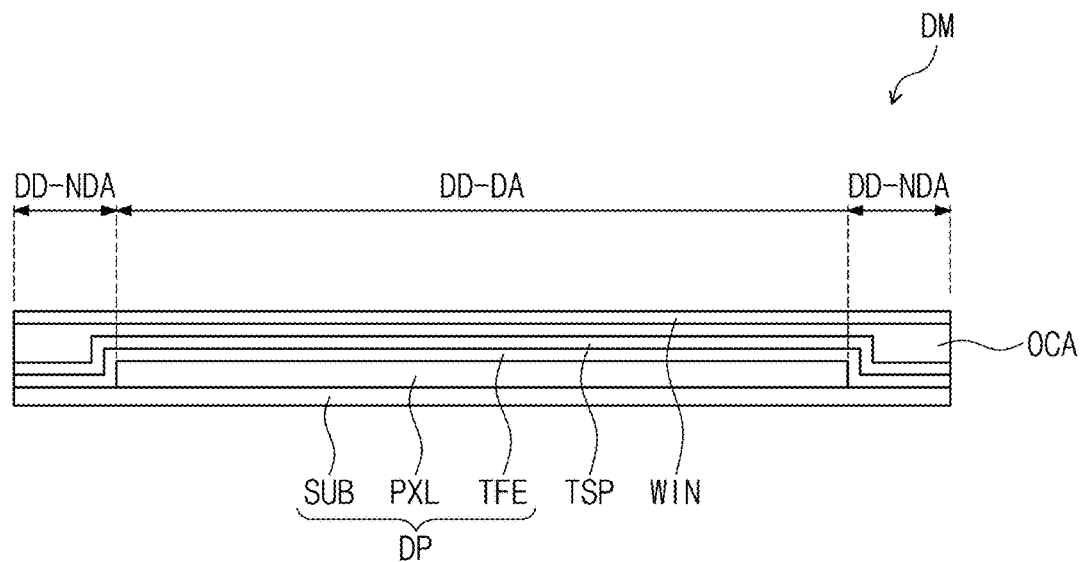
FIG. 4A is a cross-sectional view of a display module according to an embodiment of the present invention.
Figure 4B:
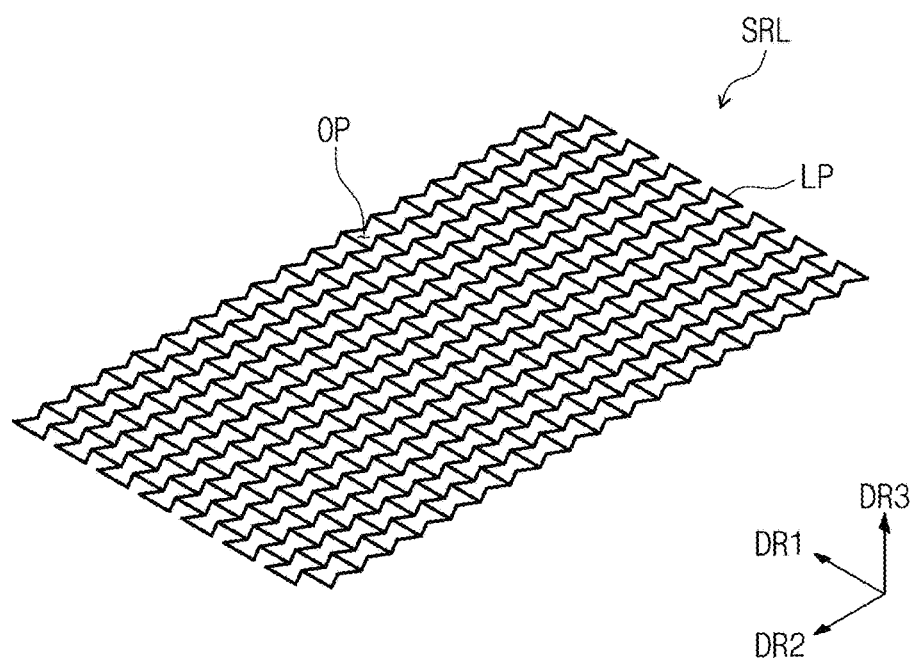
FIG. 4B is a perspective view of a stress control layer according to an embodiment of the present invention.
Figure 4C:
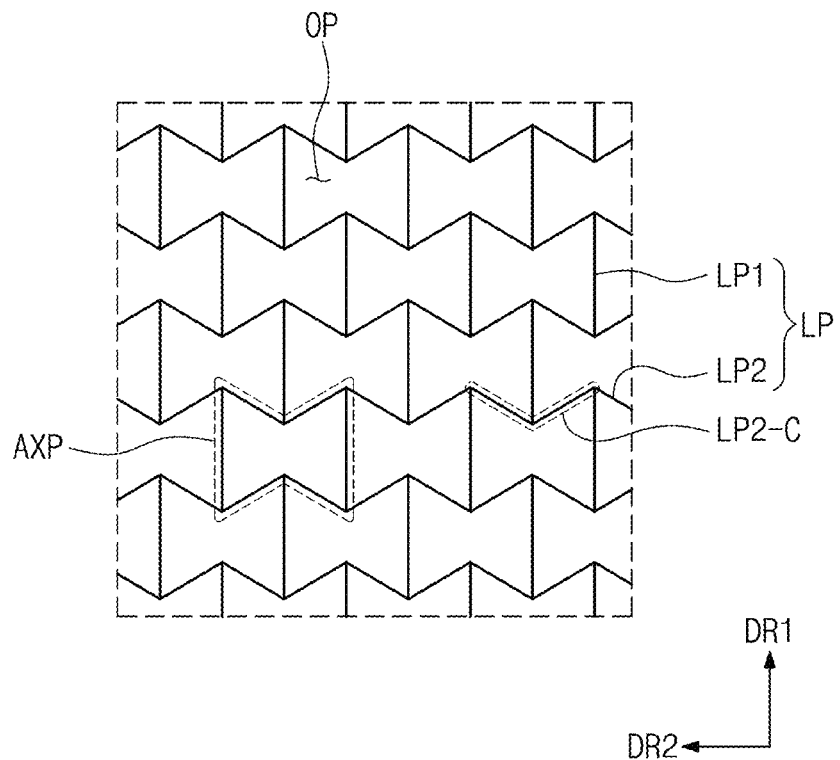
FIG. 4C is an enlarged plan view illustrating a portion of FIG. 4B.
Figure 4D:
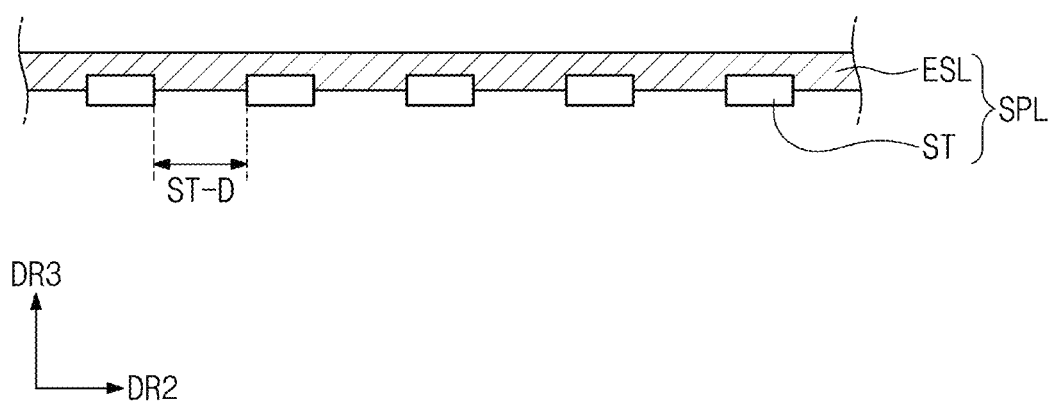
FIG. 4D is a cross-sectional view of a support layer according to an embodiment of the present invention.
Figure 4E:
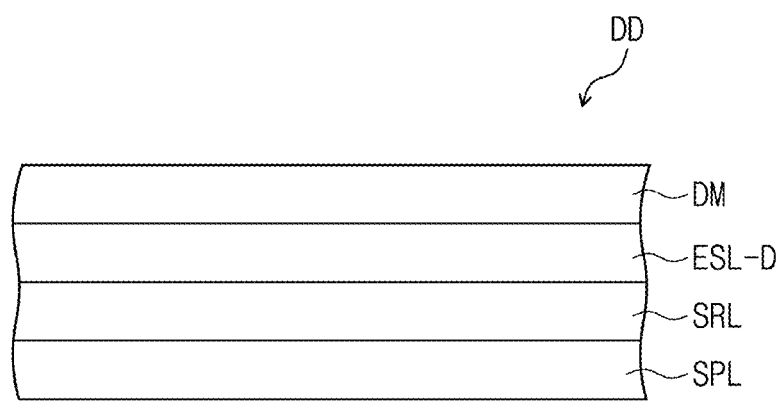
FIG. 4E is a cross-sectional view of a display device according to an embodiment of the present invention.

FIG. 3 is a cross-sectional view of the display device DD according to an embodiment of the present invention. FIG. 4A is a cross-sectional view of a display module DM according to an embodiment of the present invention. FIG. 4B is a perspective view of the stress control layer SRL according to an embodiment of the present invention. FIG. 4C is an enlarged plan view illustrating a portion of FIG. 4B. FIG. 4D is a cross-sectional view of a support layer SPL according to an embodiment of the present invention. FIG. 4E is a cross-sectional view of a display according to an embodiment of the present invention. Hereinafter, the rollable display device DD illustrated in FIGS. 2A and 2B will be mainly described.

As illustrated in FIG. 3, the display device DD according to an exemplary embodiment includes the display module DM, the stress control layer SRL, and the support layer SPL. The stress control layer SRL is disposed under the display module DM, and the support layer SPL is disposed under the stress control layer SRL. Although it is illustrated that the display module DM, the stress control layer SRL, and the support layer SPL are continuously disposed in FIG. 3, an adhesive layer may be further disposed between the display module DM, the stress control layer SRL, and the support layer SPL in another embodiment.

As illustrated in FIG. 4A, the display module DM generates an image. The display module DM may detect a user input. The display module DM may include a display panel DP, an input sensor TSP, and a window WIN. In an embodiment of the present invention, the display module DM may further include an anti-reflection unit, and the input sensor may be omitted.

The window WIN as a "physical outermost surface" may be provided on the display surface DD-IS described with reference to FIG. 1A. However, the image is generated on the display panel DP. Thus, the display panel DP provides a display surface in the sense of "surface generating an image". The window WIN and the display panel DP have substantially the same shape according to an operation type of the display device DD. For this reason, in this specification, the "physical outermost surface" and the "image generating surface" are defined as the display surface without distinction.

At least some components of the display panel DP, the input sensor TSP, the window WIN, and the anti-reflection unit may be formed by a continuous process, or at least some components may be coupled to each other through an adhesive layer OCA. FIG. 4A illustrates an example of the window WIN coupled by an adhesive member. The adhesive layer OCA may include an ordinary adhesive or pressure-sensitive adhesive, and is not particularly limited.

The display panel DP according to an embodiment of the present invention may be an emission-type display panel, but is not particularly limited thereto. For example, the display panel DP may be an organic light emitting display panel and an inorganic light emitting display panel. A light emitting layer of the organic light emitting display panel may include an organic light emitting material. The light emitting layer of the inorganic light emitting display panel may include quantum dots, quantum rods, or inorganic LEDs. Hereinafter, the organic light emitting display panel will be described as an example of the display panel DP.

The display panel DP may include a base layer SUB, a pixel layer PXL disposed on the base layer SUB, and a thin film encapsulation layer TFE disposed on the base layer SUB to cover the pixel layer PXL. The base layer SUB may include a flexible plastic substrate. For example, the base layer SUB may include polyimide ("PI").

The pixel layer PXL may include a plurality of pixels, and each of the pixels may include a pixel driving circuit and a light emitting element. The thin film encapsulation layer TFE may include at least two inorganic layers and an organic layer disposed between the at least two inorganic layers. The inorganic layers may include an inorganic material and protect the pixel layer PXL against moisture/oxygen. The organic layer may include an organic material and protect the pixel layer PXL against foreign substances such as dust particles.

As illustrated in FIGS. 4B and 4C, the stress control layer SRL may include an auxetic structure. The auxetic structure has a negative Poisson's ratio that is capable of being stretched in a biaxial direction.

The auxetic structure may be defined by a line pattern LP. The line pattern LP may include first components LP1 and second components LP2 extending in a direction different from that of the first components LP1.

As illustrated in FIG. 4C, the first components LP1 may extend in the first direction DR1. The second components LP2 may extend in the second direction DR2. Each of the first components LP1 is disposed between two adjacent second components LP2 in the first direction DR1. Each of the second components LP2 includes cell components LP2-C continuously arranged in the second direction DR2. Each of the cell components LP2-C is concavely bent once.

Two first components LP1 adjacent in the second direction DR2 and two cell components LP2-C adjacent in the first direction DR1 form one unit cell AXP. An opening OP is defined inside each of the unit cells AXP. In other words, the plurality of first components LP1 and the plurality of second components LP2 of FIG. 4C define a plurality of unit cells AXP.

A thickness of the line pattern LP may be about 5 μm to about 150 μm. The line pattern LP may include stainless steel, copper, aluminum, or high-density polyethylene ("HDPE").

As illustrated in FIG. 4D, the support layer SPL may include a plurality of support sticks ST. The plurality of support sticks ST may extend in the same direction as the rolling axis RX (see FIGS. 2A and 2B). The plurality of support sticks ST may be arranged in the second direction DR2. When describing the display device DD in the first mode illustrated in FIG. 2A, the plurality of support sticks ST may be uniformly disposed on the display device DD as a whole.

Each of the plurality of support sticks ST may have a rigid property. For example, each of the plurality of support sticks ST may include a metal. Each of the support sticks ST may include aluminum, stainless steel, or invar. In addition, each of the support sticks ST may include a metal attached to a magnet.

The plurality of support sticks ST support the display module DM illustrated in FIG. 4A so that the display device DD in the first mode described with reference to FIG. 2A may provide a flat display surface DD-IS.

Although the plurality of support sticks ST, each of which has a rectangular cross-section, are illustrated as an example, the present invention is not limited thereto. The plurality of support sticks ST may be laminated in two layers in the third direction DR3.

The support layer SPL may further include an elastomer layer ESL. The elastomer layer ESL fixes the support sticks ST spaced apart from each other. The elastomer layer ESL absorbs stress generated by the plurality of support sticks ST during repetitive rolling. In other words, the stress generated by the plurality of support sticks ST is prevented from being transmitted to the display module DM illustrated in FIG. 4A.

Although not shown separately, both ends of each of the plurality of support sticks ST may be exposed from the elastomer layer ESL on the plane. However, the present invention is not limited thereto. In an embodiment of the present invention, when viewed in a plan view, the plurality of support sticks ST may be disposed inside the elastomer layer ESL.

The elastomer layer ESL may include an elastomer. For example, the elastomer layer ESL may include at least one of thermoplastic polyurethane, silicone, thermoplastic rubbers, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, ethylene-vinyl acetate, or polydimethylsiloxane ("PDMS").

Each of the support sticks ST may have a modulus greater than that of the elastomer layer ESL. The elastomer layer ESL may have a modulus of 20 kilopascals (KPa) to 20 megapascals (MPa). Each of the support sticks ST may have a modulus of 1 gigapascals (GPa) to 200 GPa.

The support layer SPL is not limited to the structure illustrated in FIG. 4D and may be variously modified. For example, the elastomer layer ESL may extend to cover bottom surfaces of the support sticks ST, and thus, the support layer SPL may have a structure in which the support sticks ST are embedded in the elastomer layer ESL.

The display device DD illustrated in FIG. 4E further includes an elastomer layer ESL-D disposed between the display module DM and the stress control layer SRL when compared to the display device DD described with reference to FIGS. 3 to 4D. The elastomer layer ESL-D may be selected from the same or different material as the elastomer layer ESL of the support layer SPL and may have a modulus of 20 KPa to 20 MPa.

Figure 5A:
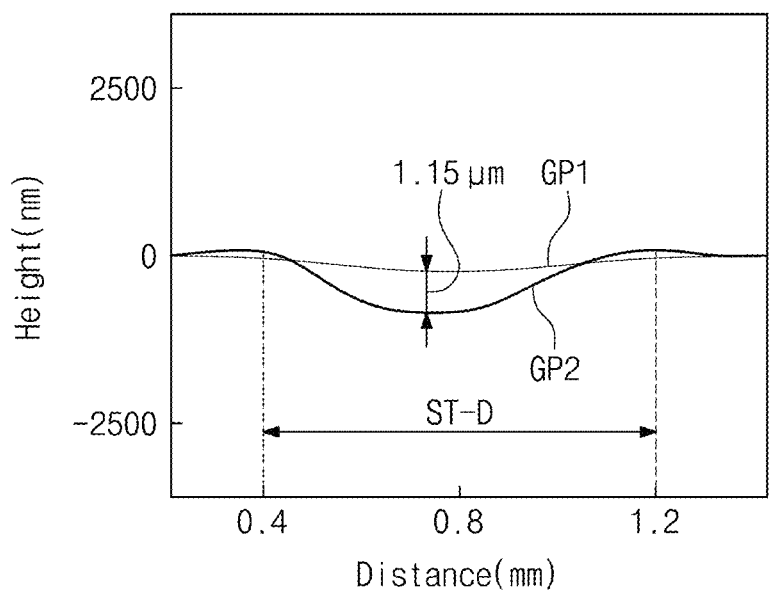
FIG. 5A is a graph illustrating bending occurring in a display device according to a comparative example.
Figure 5B:
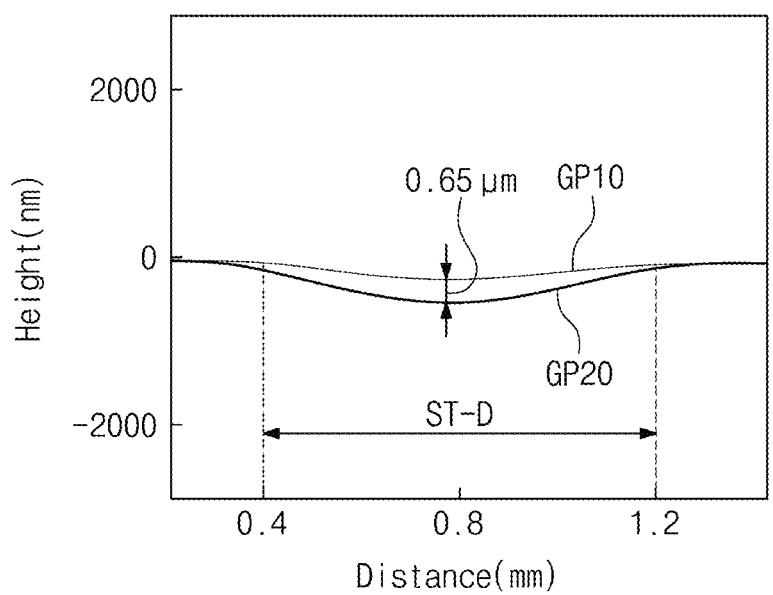
FIG. 5B is a graph illustrating bending occurring in a display device according to an embodiment of the present invention.
Figure 5C:
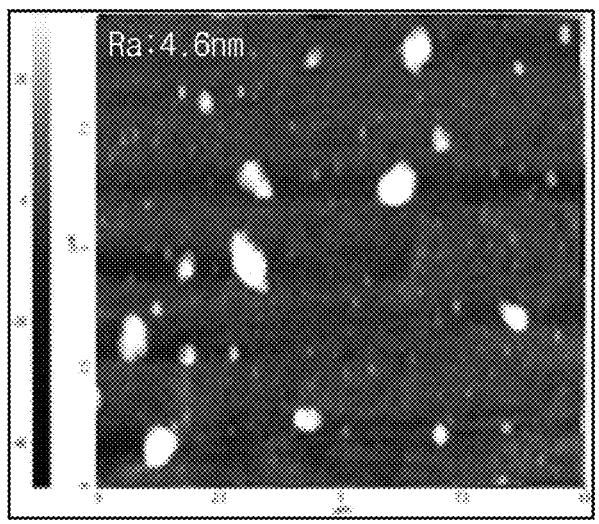
FIG. 5C is an image illustrating surface roughness of the display device according to the comparative example.
Figure 5D:
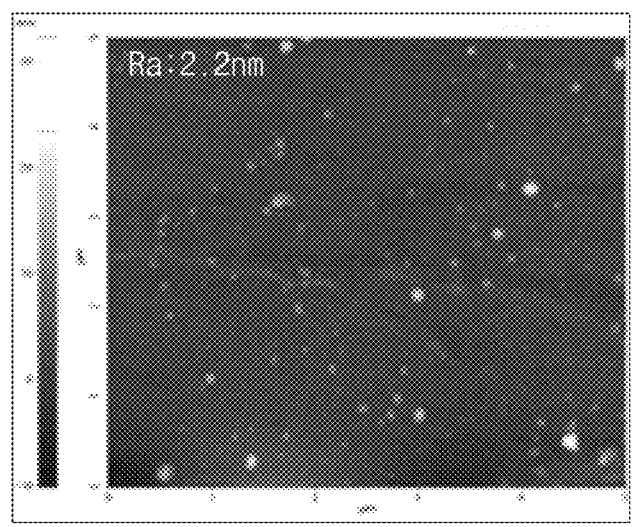
FIG. 5D is an image illustrating surface roughness of the display device according to an embodiment of the present invention.

FIG. 5A is a graph illustrating bending occurring in a display device according to a comparative example. FIG. 5B is a graph illustrating bending occurring in a display device according to an embodiment of the present invention. FIG. 5C is an image illustrating surface roughness of the display device according to the comparative example. FIG. 5D is an image illustrating surface roughness of the display device according to an embodiment of the present invention. Hereinafter, a function of a stress control layer SRL in repetitive rolling will be described in detail with reference to FIGS. 5A to 5D.

The display device DD described with reference to FIG. 4E is used for a rolling test. In the display device according to the comparative example, the stress control layer SRL is omitted when compared to the display device DD described with reference to FIG. 4E.

However, the rolling test was performed using a test display device provided with a polyimide film instead of the display module DM. Each of an elastomer layer ESL-D and an elastomer layer ESL of a support layer SPL, which are disposed under the display module DM, may be a PDMS layer.

The PDMS layer is formed on support sticks ST through spin coating. The PDMS layer is formed on one surface of the polyimide film through the spin coating. Two PDMS layers are attached with the stress control layer SRL therebetween. A display device for testing is manufactured through the above-described method.

FIGS. 5A and 5B illustrate results of performing a rolling operation 20,000 times. One rolling operation means processes of starting in the first mode of FIG. 2A, passing through the second mode of FIG. 2B, and returning to the state of the first mode.

First graphs GP1 and GP10 of FIGS. 5A and 5B show flatness of the polyimide film before rolling. The graphs indicate flatness corresponding to the adjacent two support sticks ST spaced apart from each other. A spaced distance ST-D between the two adjacent support sticks ST illustrated in FIG. 4D may be about 0.8 mm. The spaced distance ST-D is displayed in FIGS. 5A and 5B.

According to a second graph GP2 of FIG. 5A, it is seen that a portion of the polyimide film disposed in a spaced area of the two adjacent support sticks ST droops by 1.15 μm at most when compared to the state before the rolling. In contrast, according to a second graph GP20 of FIG. 5B, it is seen that a portion of the polyimide film disposed in a spaced area of the two adjacent support sticks ST droops by 0.65 μm at most when compared to the state before the rolling.

According to this embodiment, the drooping height was reduced by about 43% when compared to the comparative example. According to this embodiment, a height difference of the polyimide film disposed between the two adjacent support sticks ST was also reduced when compared to the comparative example. This is because self-stretching occurring in an auxetic structure to reduce transfer of stress from the support sticks ST to the polyimide film.

In addition, in the display device DD according to an embodiment of the present invention, surface roughness of the polyimide film disposed between the two adjacent support sticks ST is improved about twice or more when compared to the display device according to the comparative example. It is confirmed that, as illustrated in FIG. 5C, the surface roughness of the display device according to the comparative example is 4.6 nanometers (nm), and as illustrated in FIG. 5D, the surface roughness of the display device DD according to the embodiment of the present invention is 2.2 nm.

FIG. 6A to 6E are plan views illustrating a stress control layer according to an embodiment of the present invention.

Referring to FIGS. 6A to 6E, a line pattern LP having a shape different from that of the line pattern LP illustrated in FIG. 4C is illustrated as an example.

Figure 6A:
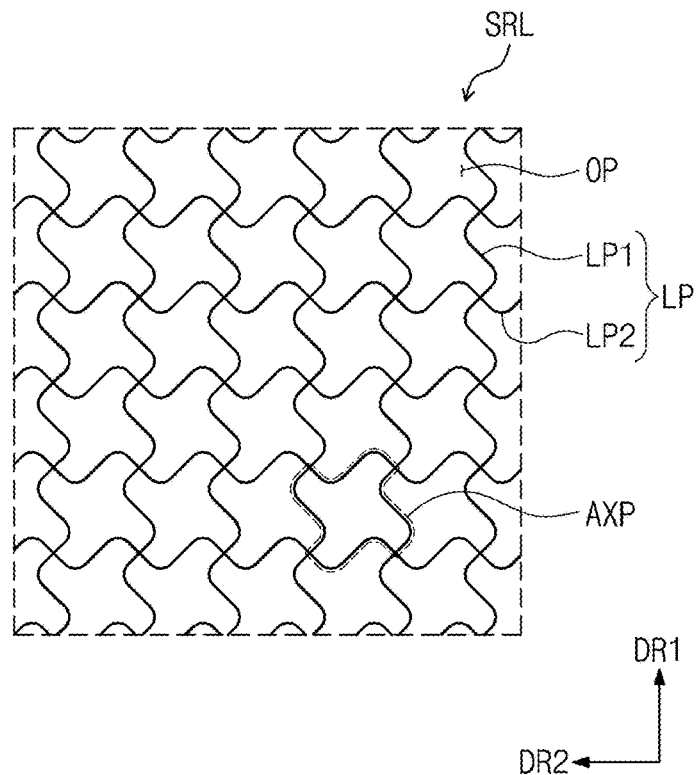
FIGS. 6A to 6E are plan views illustrating a stress control layer according to an embodiment of the present invention.
Figure 6B:
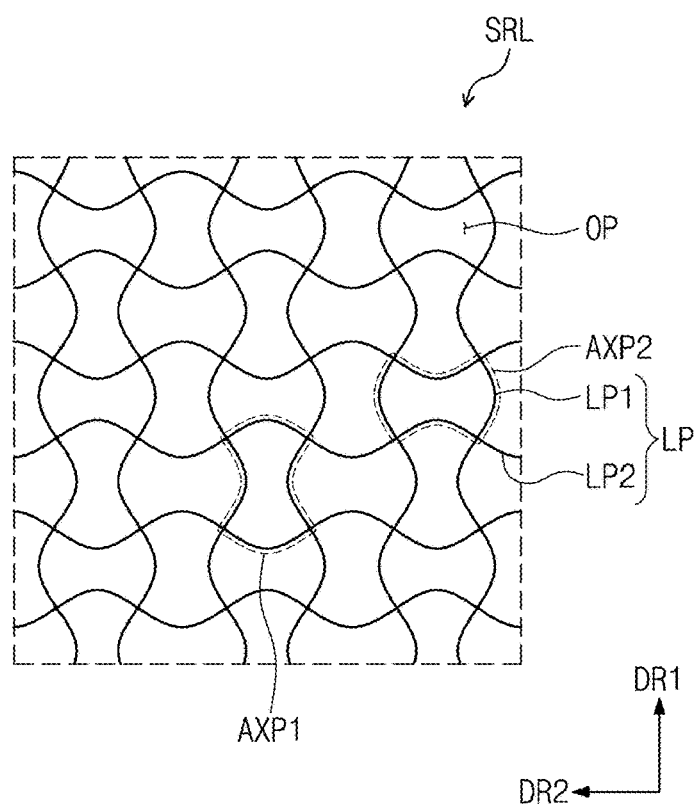

As illustrated in FIGS. 6A and 6B, the line pattern LP may include first components LP1 and second components LP2, but different types of unit cells AXP, AXP1, and AXP2 are defined. A negative Poisson's ratio of the auxetic structure illustrated in FIG. 6A may be −0.5, and a negative Poisson's ratio of the auxetic structure illustrated in FIG. 6B may be −0.3. The auxetic structure illustrated in FIG. 6B may include first unit cells AXP1 and second unit cells AXP2, which are alternately arranged. A combination of one first unit cell AXP1 and one second unit cell AXP2, which are adjacent to each other, may correspond to one unit cell.

Figure 6C:
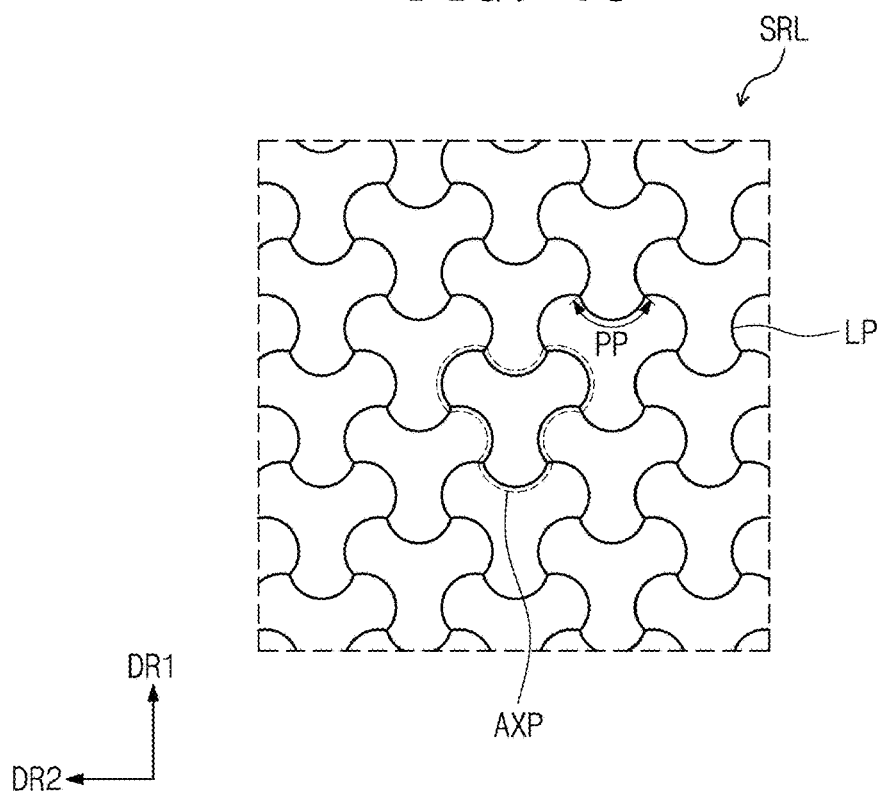

As illustrated in FIG. 6C, the line pattern LP may include unit cells AXP in which distinction between the first and second components is unclear. A negative Poisson's ratio of the auxetic structure illustrated in FIG. 6C may be −0.1.

When folded or rolled in a uniaxial direction, uniaxial stress is mainly generated. In this case, an auxetic structure having a low absolute value of the negative Poisson's ratio is advantageous for structural expansion and contraction reduction and stress reduction with respect to the uniaxial stress. When folded or rolled in a biaxial direction, an auxetic structure having a high absolute value of the negative Poisson's ratio is more advantageous.

Figure 6D:
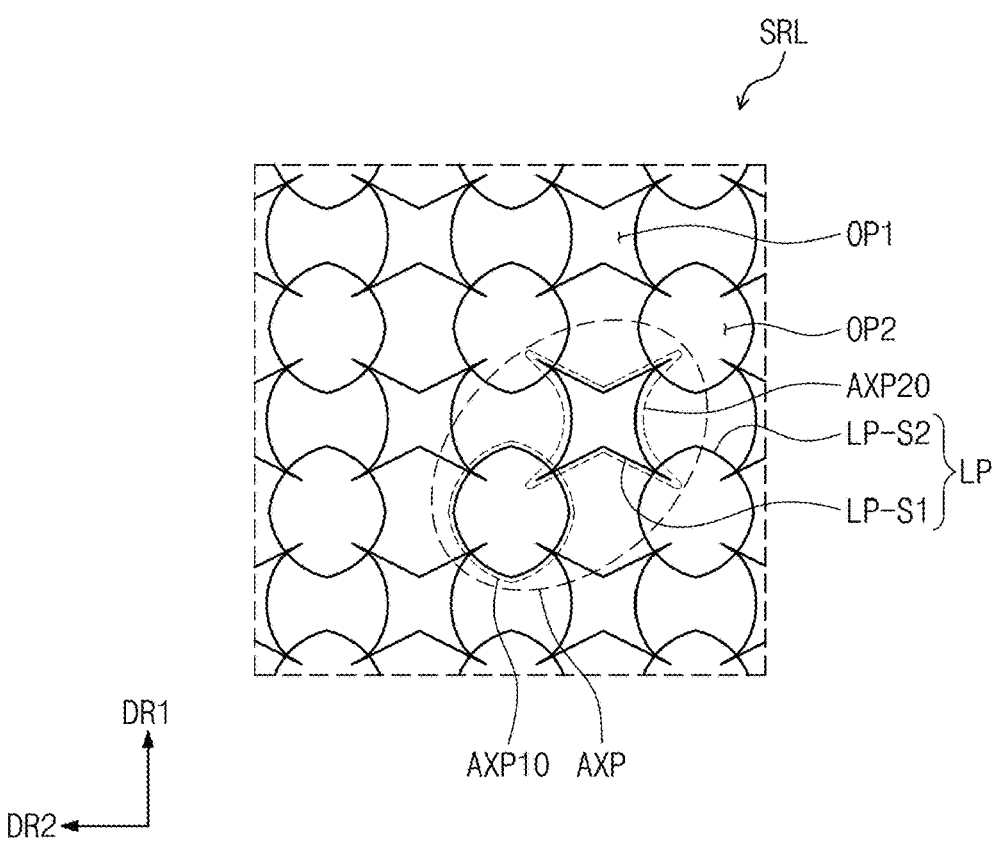

As illustrated in FIG. 6D, the line pattern LP may include first patterns LP-S1 and second patterns LP-S2, which have shapes different from each other. The second pattern LP-S2 is disposed at a center of the four first patterns LP-S1, and the first pattern LP-S1 is disposed at a center of the four second patterns LP-S2. A first opening OP1 is defined inside each of the first patterns LP-S1, and a second opening OP2 is defined inside each of the second patterns LP-S2. The four first patterns LP-S1 and the second pattern LP-S2 disposed at the center of the four first patterns LP-S1 overlap each other to form an intersection area.

The auxetic structure illustrated in FIG. 6D may include first unit cells AXP10 and second unit cells AXP20, which are alternately arranged. The first pattern LP-S1 may define the first unit cell AXP10, and the second pattern LP-S2 may define the second unit cell AXP20. A combination of one first unit cell AXP10 and one second unit cell AXP20, which are adjacent to each other in a diagonal direction, may correspond to one unit cell AXP.

Figure 6E:
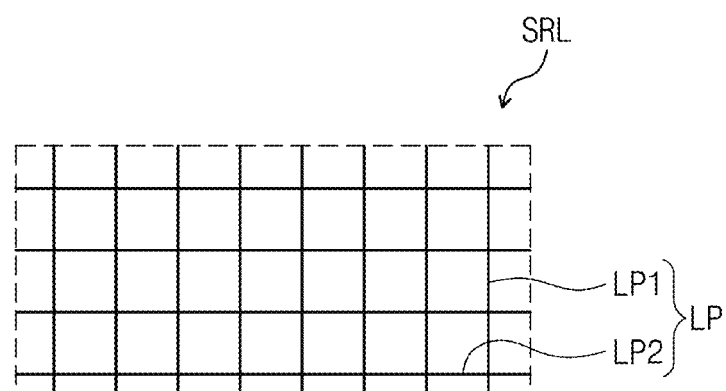
Figure 6E:
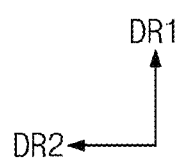

As illustrated in FIG. 6E, the line pattern LP includes the first components LP1 and the second components LP2, but may not have the auxetic structure. According to this embodiment, even if a stress blocking effect is lower than that of the auxetic structure described with reference to FIG. 5B, a portion of the stress may be blocked.

Figure 7A:
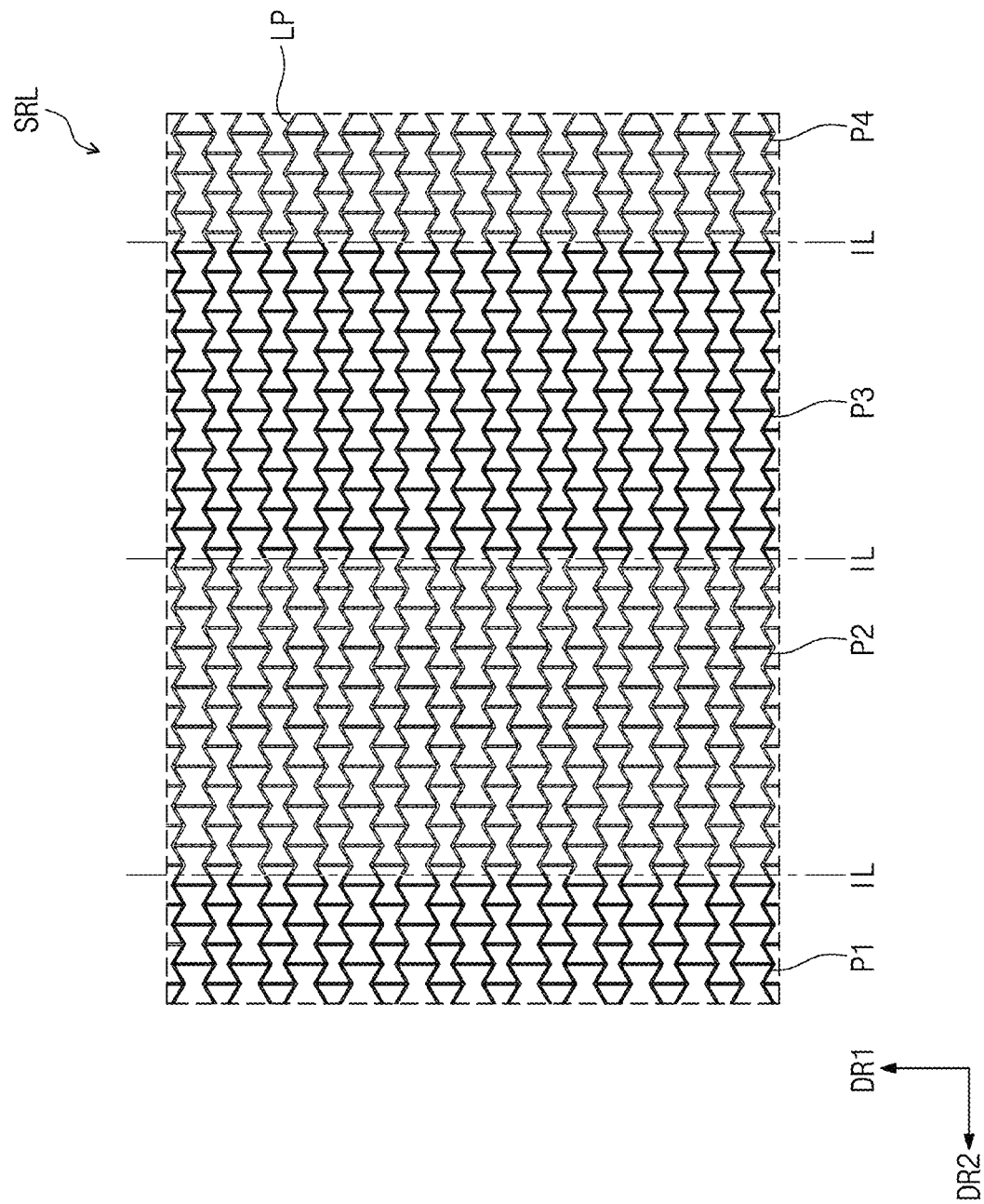
FIG. 7A is a plan view illustrating a stress control layer according to an embodiment of the present invention.
Figure 7B:
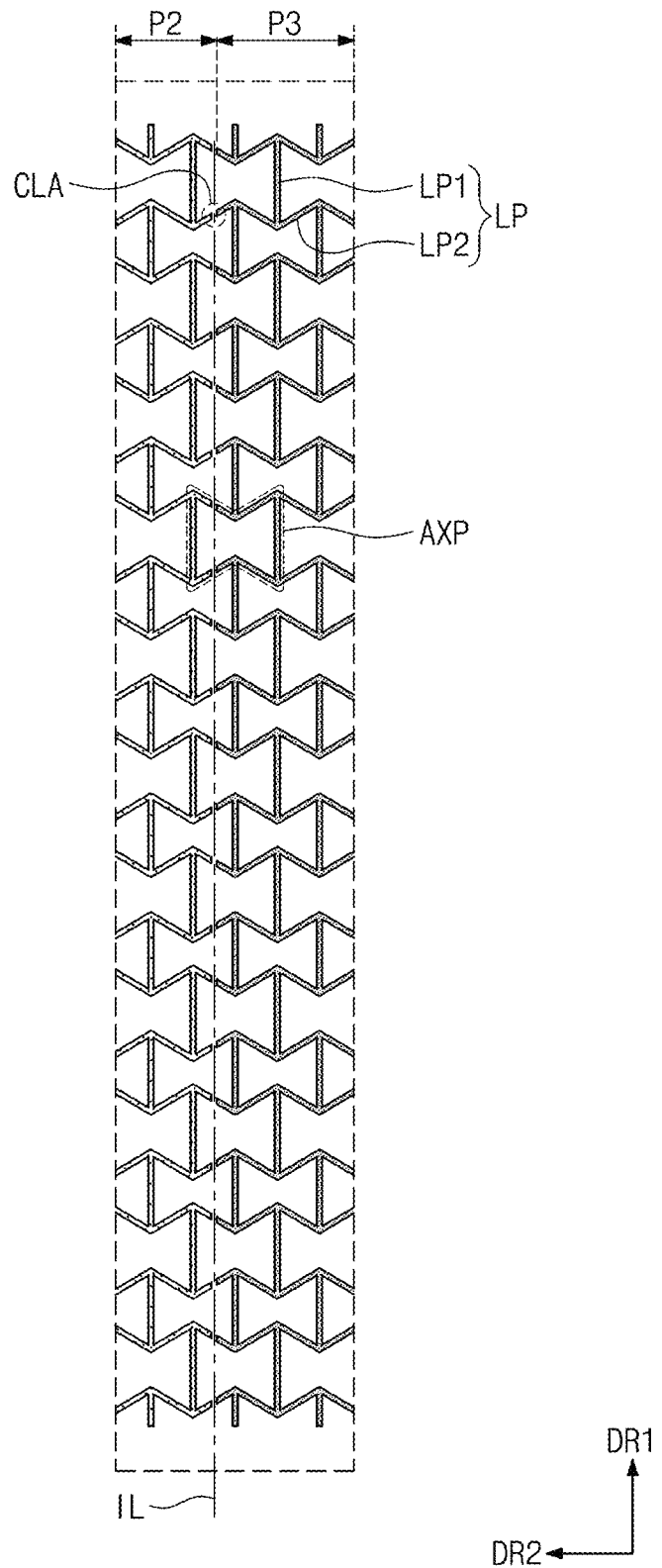
FIG. 7B is an enlarged plan view illustrating a portion of an area of FIG. 7A.

FIG. 7A is a plan view illustrating a stress control layer SRL according to an embodiment of the present invention. FIG. 7B is an enlarged plan view illustrating a portion of an area of FIG. 7A.

As illustrated in FIGS. 7A and 7B, an auxetic structure of the stress control layer SRL may include a plurality of portions, which are divided in a direction (the second direction DR2 in FIG. 7A) perpendicular to a reference axis (rolling axis or folding axis).

The plurality of portions may be divided by imaginary lines IL. In FIG. 7A, four portions P1 to P4 and three imaginary lines IL are illustrated as an example. A line connecting a plurality of disconnection points CLA to each other may be defined as an imaginary line IL (See FIG. 7B). Here, it is assumed that two disconnection points CLA adjacent in the first direction DR1 are connected with the shortest line to make the imaginary line IL.

All of components disposed on the imaginary line IL extending in the first direction DR1 are disconnected by the disconnection points CLA. In other words, each of the disconnection points CLA is an area from which a portion of the first component LP1 or the second component LP2 is partially removed.

In this embodiment, a unit cell AXP defined by the first component LP1 and the second component LP2, in which extension directions are very contrasted in the first directional axis DR1 as the reference axis, is illustrated as an example. The line pattern LP forming the unit cells AXP may include only a component extending in a direction approximate to the reference axis or only a component extending in a direction non-approximate to the reference axis.

In this case, it is sufficient if the disconnection points CLA are defined as a component, of which the extension direction is more approximate to a direction that is orthogonal to the reference axis, among the plurality of components. For example, in the unit cells AXP illustrated in FIG. 6C, the disconnection points CLA may be formed on parallel portions PP. The parallel portions PP are portions that are more approximate or parallel to a direction orthogonal to the reference axis (the second direction DR2 in FIG. 6C) when compared to other portions of the unit cell AXP. In the unit cells AXP illustrated in FIG. 6D, the disconnection points CLA are formed in a component extending in the second direction DR2 of the first patterns LP-S1 or formed at inflection points of the second patterns LP-S2.

Although the imaginary line IL parallel to the first direction DR1 is illustrated, the present invention is not limited thereto, and the imaginary line IL may be an oblique line or a curved line, which is inclined in the first direction DR1. Here, even if the term "curved line" is not a mathematically defined curved line, it is sufficient if the imaginary line connecting the plurality of disconnection points CLA to each other is similar to the curved shape. The imaginary line IL may be bent multiple times. It is unnecessary that the three imaginary lines IL illustrated in FIG. 7A have the same shape as each other.

As illustrated in FIGS. 7A and 7B, the stress control layer SRL may be divided into a plurality of portions P1 to P4, and thus, in the rolled state (see FIG. 2A), the stress may be prevented from being accumulated in the long axis direction (the second direction DR2 in FIG. 7A) of the display device DD.

Figure 8B:
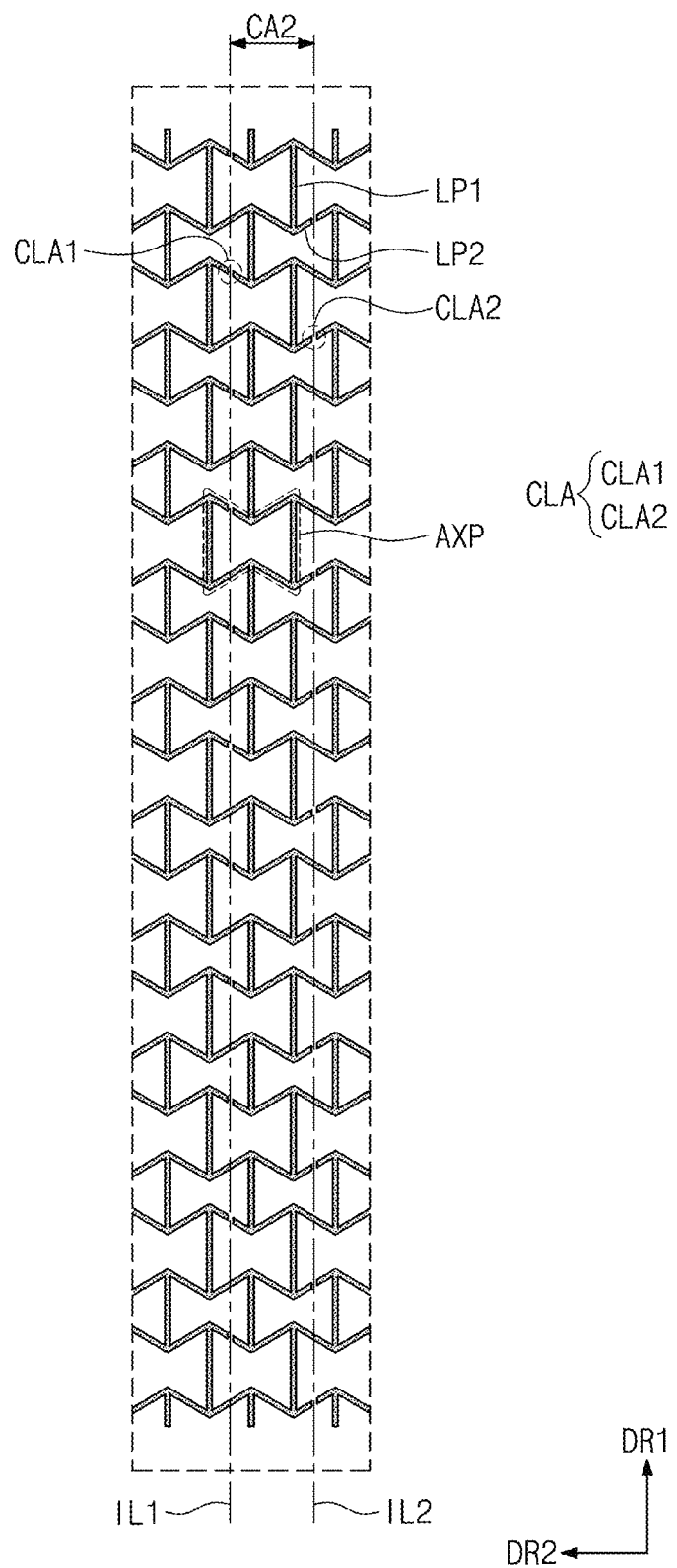
FIG. 8B is an enlarged plan view illustrating a portion of an area of FIG. 8A.

FIG. 8A is a plan view illustrating a stress control layer SRL according to an embodiment of the present invention. FIG. 8B is an enlarged plan view illustrating a portion of an area of FIG. 8A.

A plurality of disconnection areas CA1, CA2, and CA3 spaced apart from each other in the second direction DR2 may be defined in the stress control layer SRL. A plurality of disconnection points CLA are formed on each of the plurality of disconnection areas CA1, CA2, and CA3. Although not separately indicated, an area disposed between the plurality of disconnected areas CA1, CA2, and CA3 may be defined as a non-disconnection area. Although the plurality of disconnection points CLA are formed on the plurality of disconnection areas CA1, CA2, and CA3 in this embodiment, the line pattern LP may have an integral shape.

Each of the disconnected areas CA1, CA2, and CA3 is an area disposed between a first imaginary line IL1 and a second imaginary line IL2. A plurality of disconnection points CLA1 (hereinafter, referred to as "first disconnection points") are formed at some of intersections of the line pattern LP and the first imaginary line ILL and a plurality of disconnection points CLA2 (hereinafter, referred to as "second disconnection points") are formed at some of intersections of the line pattern LP and the second imaginary line IL2. However, unlike illustrated in FIG. 7B, not all the components of the line pattern LP disposed on the imaginary line IL are disconnected.

Each of the disconnection areas CA1, CA2, and CA3 may prevent stress from being accumulated in the long axis direction (the second direction DR2 in FIG. 7A) of the display device DD in the rolled state (see FIG. 2A). This is because the stress accumulated in the auxetic structure in the long axis direction is cut off by the disconnection areas CA1, CA2, and CA3.

The first disconnection points CLA1 correspond to disconnection points disposed at one side (left side in FIG. 8B) in the second direction DR2 among the plurality of disconnection points CLA that are closely arranged. The second disconnection points CLA2 correspond to disconnection points disposed on the other side (right side in FIG. 8B) in the second direction DR2 among the plurality of disconnection points CLA that are closely arranged.

Two first disconnection points CLA1 disposed adjacent to each other in the first direction DR1 among the first disconnection points CLA1 are connected with the shortest line through the first imaginary line IL1. Referring to FIG. 8B, since a disconnection point is not defined in the second component LP2 disposed between two adjacent first disconnection points CLA1 in the first direction DR1, the first imaginary line IL1 is a group of line segments linearly connected between the two adjacent first disconnection points CLA1. If a disconnection point (virtual point) is currently defined in the second component LP2 disposed between the first disconnection points CLA1 to a left side of the first imaginary line IL1 illustrated in FIG. 8B, since the first imaginary line IL1 passes through the virtual point, the first imaginary line IL1 may not be parallel to the first direction DR1, but may include at least one bent portion.

According to an embodiment illustrated in FIG. 8B, each of the first imaginary line IL1 and the second imaginary line IL2 is parallel to the first direction DR1. When the second disconnection points CLA2 are moved along the first imaginary line ILL the imaginary line IL illustrated in FIG. 7B may be substantially defined. This is because the first disconnection points CLA1 and the second disconnection points CLA2 are alternately disposed on the first imaginary line IL1 and the second imaginary line IL2 in the first direction DR1.

A width of the disconnection area CA2 may correspond to an interval between the first imaginary line IL1 and the second imaginary line IL2. When any one of the first imaginary line IL1 and the second imaginary line IL2 is not a straight line, i.e., when a width of the disconnection area CA2 varies depending on the areas, the width of the disconnection area CA2 may vary in the first direction DR1. In this case, an average width of the disconnection area CA2 may be defined as the width of the disconnection area CA2.

In the second direction DR2, a width of each of the three disconnection areas CAL CA2, and CA3 may be 1% to 10% of a width of the stress control layer SRL in the second direction DR2. In the second direction DR2, a width of each of the three disconnection areas CAL CA2, and CA3 may be about 1 mm to about 100 mm. The width of each of the three disconnection areas CAL CA2, and CA3 may be determined based on a length of the stress control layer SRL in the second direction DR2. The widths of the three disconnected areas CAL CA2, and CA3 are not limited to the same.

Although it is illustrated that additional disconnection points are not disposed between the first imaginary line IL1 and the second imaginary line IL2 in this embodiment, the present invention is not limited thereto. Third disconnection points arranged randomly or according to a predetermined rule may be further disposed between the first imaginary line IL1 and the second imaginary line IL2.

Figure 9:
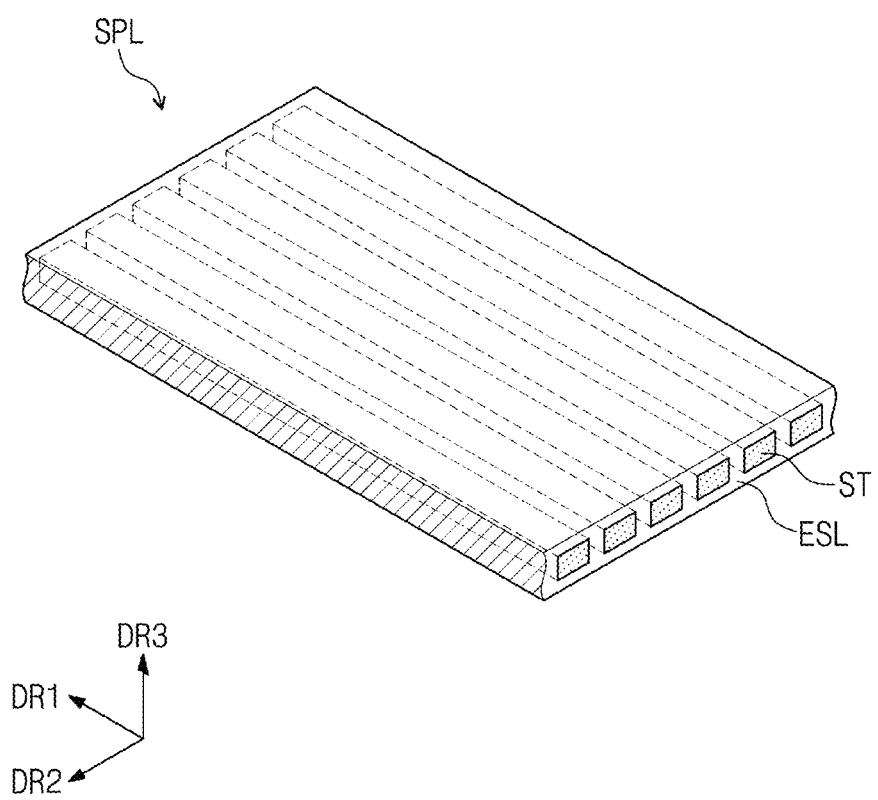
FIG. 9 is a perspective view illustrating a support layer according to an embodiment of the present invention.
Figure 10:
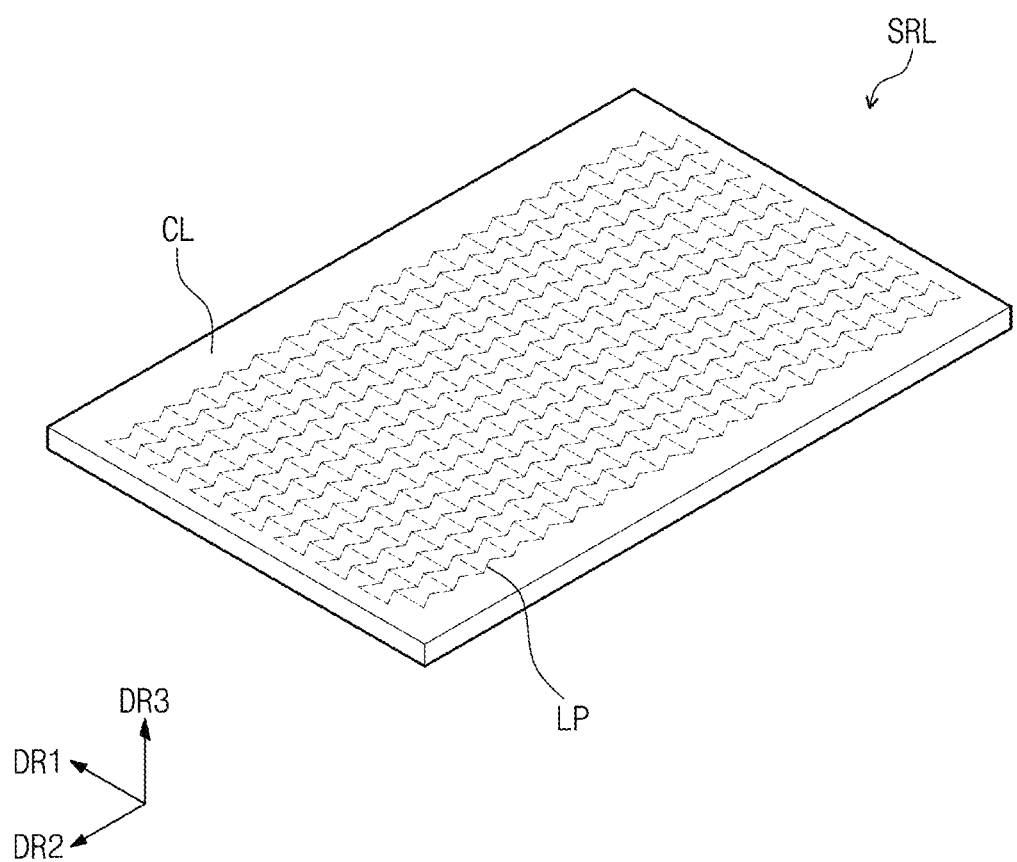
FIG. 10 is a perspective view of a stress control layer according to an embodiment of the present invention.

FIG. 9 is a perspective view illustrating a support layer SPL according to an embodiment of the present invention. FIG. 10 is a perspective view of a stress control layer SRL according to an embodiment of the present invention. Hereinafter, detailed descriptions of the same components as those described with reference to FIGS. 1 to 7d will be omitted.

Referring to FIG. 9, a support layer SPL may include an elastomer layer ESL and a plurality of support sticks ST embedded in the elastomer layer ESL. After disposed the support sticks in a mold, a resin is provided in the mold. After the resin is cured in a state in which the support sticks are deposited in the resin, the cured resin may be separated from the mold to form the support layer SPL including the support sticks ST embedded in the elastomer layer ESL.

As illustrated in FIG. 10, the stress control layer SRL may include an outer layer CL and a line pattern LP embedded in the outer layer CL.

In an embodiment of the present invention, the outer layer CL may be an adhesive layer. The outer layer CL may be disposed between a rear surface of a display module DM and the support layer SPL to be coupled to each other as illustrated in FIG. 3. The auxetic structure of the stress control layer SRL may be embedded in the adhesive layer.

In an embodiment of the present invention, the outer layer CL may be an elastomer layer ESL. A manufacturing method may be similar to the method for manufacturing the support layer SPL described with reference to FIG. 9.

It will be apparent to those skilled in the art that various modifications and deviations can be made in the present invention. Thus, it is intended that the present invention covers the modifications and deviations of this invention provided they come within the scope of the appended claims and their equivalents.

Accordingly, the technical scope of the present invention should not be limited to the contents described in the detailed description of the specification, but should be determined by the claims.

INDUSTRIAL APPLICABILITY

The present invention may be applied to the newly developed rollable display device or foldable display device to reduce the defect rate of the display device, and thus, the industrial applicability is recognized.

The invention claimed is:

1. A display device comprising:
a display panel providing a display surface defined by a first direction and a second direction crossing the first direction;
a stress control layer disposed on a rear surface of the display panel and comprising an auxetic structure having a negative Poisson's ratio; and
a support layer disposed under the stress control layer to support the display panel,
wherein, in a first mode of the display device, the display surface provides a flat surface, and in a second mode of the display device, at least a portion of the display surface provides a curved surface that is curved with respect to a reference axis, and
wherein the support layer comprises a plurality of support sticks, each of the support sticks extending parallel to the reference axis, in the first mode, the plurality of support sticks are spaced apart in a direction orthogonal to the reference axis.

2. The display device of claim 1, wherein the support layer further comprises an elastomer layer, and
at least a portion of the elastomer layer is disposed between the stress control layer and the plurality of support sticks.

3. The display device of claim 2, wherein the plurality of support sticks are embedded in the elastomer layer.

4. The display device of claim 1, wherein the auxetic structure comprises a line pattern defining a plurality of unit cells, and
a plurality of disconnection points are defined in the line pattern.

5. The display device of claim 4, wherein, within a direction orthogonal to the reference axis, a partial area of the auxetic structure is defined as a disconnection area disposed between a first imaginary line and a second imaginary line,
each of the first imaginary line and the second imaginary line is parallel to the reference axis,
in a direction orthogonal to the reference axis, disconnection points, which are disposed at a one side, of the plurality of disconnection points are disposed on the first imaginary line, and disconnection points, which are disposed at an opposite side, of the plurality of disconnection points are disposed on the second imaginary line, and
in the direction orthogonal to the reference axis, a width of the disconnection area is 1% to 10% of a width of the auxetic structure.

6. The display device of claim 4, wherein the line pattern comprises first components and second components,
the second components extend in a direction different from a direction that the first components are extended, and
the plurality of disconnection points are defined in components, of which an extension direction is more approximate to a direction that is orthogonal to the reference axis, among the first components and the second components.

7. The display device of claim 4, wherein the auxetic structure comprises a plurality of portions spaced apart from each other in a direction orthogonal to the reference axis,
each of the plurality of disconnection points is defined in a corresponding imaginary line of a plurality of imaginary lines, and
two adjacent portions of the plurality of portions are divided by a corresponding imaginary line of the plurality of imaginary lines.

8. The display device of claim 4, wherein the line pattern has a thickness of 5 micrometers (μm) to 150 μm.

9. The display device of claim 4, wherein the line pattern comprises stainless steel, copper, aluminum, or high-density polyethylene (HDPE).

10. The display device of claim 1, wherein the stress control layer further comprises an adhesive layer configured to couple the rear surface of the display panel to the auxetic structure.

11. The display device of claim 10, wherein the auxetic structure is embedded in the adhesive layer.

12. The display device of claim 1, wherein the stress control layer further comprises an elastomer layer, and
the auxetic structure is embedded in the elastomer layer.

13. The display device of claim 1, wherein the display device is foldable or rollable.

14. A display device comprising:
a display panel;
a stress control layer disposed on a rear surface of the display panel and comprising a line pattern configured to define a plurality of openings; and
a support layer disposed under the stress control layer to support the display panel, wherein the line pattern comprises first components and second components, and the second components extend in a direction different from a direction in which the first components are extended.

15. The display device of claim 14, wherein the line pattern comprises an auxetic structure having a negative Poisson's ratio.

16. The display device of claim 14, wherein the display panel provides a display surface, and
in a first mode of the display device, the display surface provides a flat surface, and in a second mode of the display device, at least a portion of the display surface provides a curved surface with respect to a reference axis.

17. The display device of claim 16, wherein a plurality of disconnection points are defined in the line pattern,
within a direction orthogonal to the reference axis, each of areas in which the plurality of disconnection points are disposed is defined as a disconnection area, and
within the direction orthogonal to the reference axis, the disconnection area has a width of 1 millimeter (mm) to 100 mm.

18. The display device of claim 16, wherein a plurality of disconnection points are defined in the line pattern, and
the plurality of disconnection points are defined in components, of which an extension direction is more approximate to a direction that is orthogonal to the reference axis, among the first components and the second components.

19. An electronic equipment comprising:
a display device,
wherein the display device comprises
a display panel providing a display surface defined by a first direction and a second direction crossing the first direction;
a stress control layer disposed on a rear surface of the display panel and comprising an auxetic structure having a negative Poisson's ratio; and
a support layer disposed under the stress control layer to support the display panel,
wherein, in a first mode of the display device, the display surface provides a flat surface, and in a second mode of the display device, at least a portion of the display surface provides a curved surface that is curved with respect to a reference axis, and
wherein the support layer comprises a plurality of support sticks, each of the support sticks extending parallel to the reference axis, in the first mode, the plurality of support sticks are spaced apart in a direction orthogonal to the reference axis.

* * * * *